(12) United States Patent
Narita et al.

(10) Patent No.: US 11,860,190 B2
(45) Date of Patent: Jan. 2, 2024

(54) PROBE UNIT WITH A FREE LENGTH CANTILEVER CONTACTOR AND PEDESTAL

(71) Applicant: KABUSHIKI KAISHA NIHON MICRONICS, Tokyo (JP)

(72) Inventors: Satoshi Narita, Tokyo (JP); Shou Harako, Tokyo (JP); Jukiya Fukushi, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 0 days.

(21) Appl. No.: 17/730,579

(22) Filed: Apr. 27, 2022

(65) Prior Publication Data

US 2022/0390489 A1 Dec. 8, 2022

(30) Foreign Application Priority Data

Jun. 2, 2021 (JP) .................................. 2021-093155

(51) Int. Cl.
*G01R 1/067* (2006.01)
*G01R 1/073* (2006.01)

(52) U.S. Cl.
CPC ..... *G01R 1/06727* (2013.01); *G01R 1/07307* (2013.01)

(58) Field of Classification Search
CPC ............ G01R 1/06727; G01R 1/07307; G01R 1/06772
See application file for complete search history.

(56) References Cited

U.S. PATENT DOCUMENTS

| 2002/0075019 A1* | 6/2002 | Hayden .............. | G01R 1/06772 |
| | | | 324/755.07 |
| 2015/0185253 A1* | 7/2015 | Ku ..................... | G01R 1/06772 |
| | | | 324/754.03 |
| 2018/0095111 A1* | 4/2018 | Tsai ................... | G01R 1/07314 |

FOREIGN PATENT DOCUMENTS

| JP | 2011-196821 A | 10/2011 |
| TW | 201839405 A | 11/2018 |

OTHER PUBLICATIONS

Translation of KR 101040733 B1 (Year: 2011).*
First OA issued in corresponding Taiwan patent Application No. 111116775 issued May 15, 2023.

* cited by examiner

*Primary Examiner* — Paresh Patel
(74) *Attorney, Agent, or Firm* — BACON&THOMAS,PLLC (57) ABSTRACT

It is possible to make the free length of a contactor uniform even when the contactor is joined to a position that deviates from a joint position in a high-frequency conducting path and make contact with an electrode with stability, which improves measurement quality. A probe unit according to the present disclosure includes: a coaxial connector that is attached to a main body and gives and receives an electrical signal to and from a tester via a coaxial cable; a high-frequency conducting path that is connected to the coaxial connector and transmits an electrical signal; a plurality of contactors, each having a tip portion that makes electrical contact with an electrode of an object to be inspected and giving and receiving an electrical signal to and from the high-frequency conducting path; and a pedestal that is interposed between the contactor and the high-frequency conducting path, and the pedestal is provided in each con- (Continued)

tactor such that a free length of the contactor is a predetermined length.

12 Claims, 10 Drawing Sheets

PROBE UNIT WITH A FREE LENGTH CANTILEVER CONTACTOR AND PEDESTAL

CROSS-REFERENCE TO RELATED APPLICATIONS

The present application claims, under 35 USC 119, priority of Japanese Patent Application No. 2021-093155 filed on Jun. 2, 2021.

TECHNICAL FIELD

The present disclosure relates to a probe unit and can be applied to, for example, a probe unit that is used in an inspection apparatus which makes an inspection of the electrical characteristics of a semiconductor integrated circuit.

BACKGROUND ART

A high-frequency probe connected to a coaxial cable is used when, for example, an inspection of the electrical characteristics of a high-frequency circuit is made (see PTL 1).

The related art disclosed in PTL 1 is the configuration of a high-frequency probe in which a hollow structure is provided between a signal line and a GND line.

CITATION LIST

Patent Literature

PTL 1: JP-A-2011-196821

SUMMARY OF INVENTION

Technical Problem

Electrode pads of an object to be inspected vary in height. Cantilever type probes are therefore adopted as contactors, which allows the contactors to be elastically deformed by overdrive and to make contact with the electrode pads irrespective of variations in height.

However, if the contactor is joined to a position that deviates from a joint position when the contactor is joined to a high-frequency conducting path, this causes the free length of the cantilever type contactor to change, resulting in variations in the amounts of the pressure of the contactors. This prevents the contactors from making contact with the electrode pads in a satisfactory manner and affects measurement quality.

In view of the above-described problem, a probe unit that can make the free length of a contactor uniform even when the contactor is joined to a position that deviates from a joint position in a high-frequency conducting path, stably make contact with an electrode, and improve measurement quality is needed.

Solution to Problem

To solve this problem, a probe unit according to the present disclosure includes: a coaxial connector that is attached to a main body and gives and receives an electrical signal to and from a tester via a coaxial cable; a high-frequency conducting path that is connected to the coaxial connector and transmits an electrical signal; a plurality of contactors, each having a tip portion that makes electrical contact with an electrode of an object to be inspected and giving and receiving an electrical signal to and from the high-frequency conducting path; and a pedestal that is interposed between the contactor and the high-frequency conducting path, and the pedestal is provided in each contactor such that a free length of the contactor is a predetermined length.

Advantageous Effects of Invention

According to the present disclosure, it is possible to make the free length of a contactor uniform, stably make contact with an electrode, and improve measurement quality.

DESCRIPTION OF EMBODIMENTS (A) First Embodiment

Hereinafter, a first embodiment of a probe unit according to the present disclosure will be described in detail with reference to the drawings.

(A-1) Configuration of First Embodiment

Figure 2:
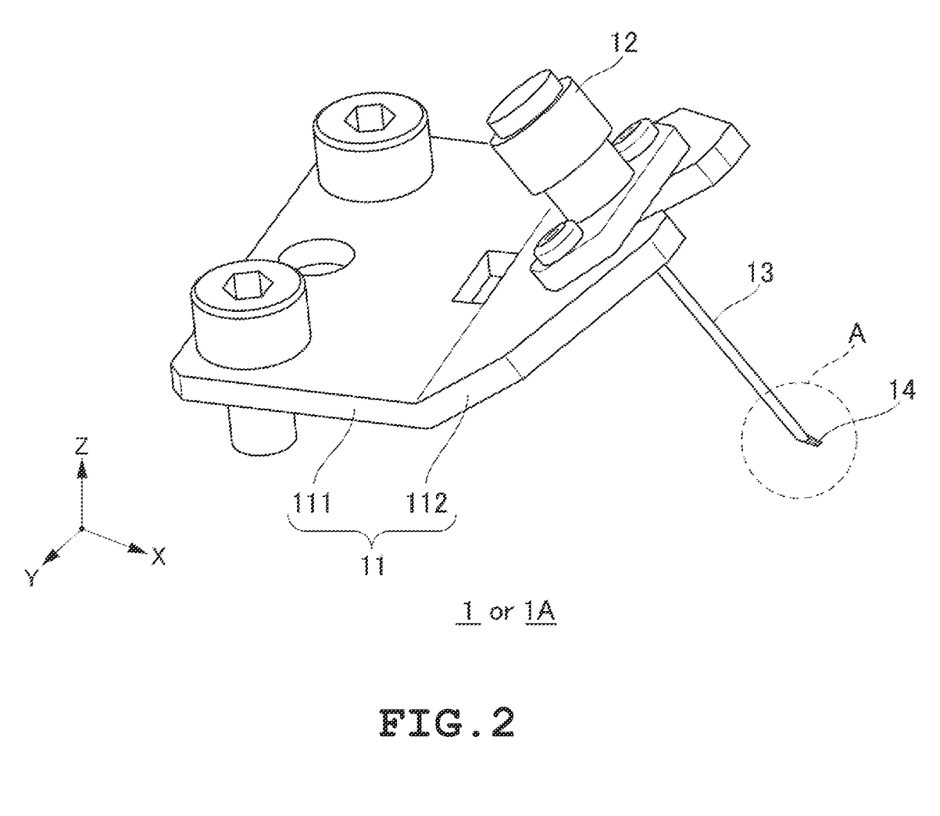
FIG. 2 is an overall configuration diagram showing the overall configuration of a probe unit according to a first embodiment.

FIG. 2 is an overall configuration diagram showing the overall configuration of a probe unit according to the first embodiment.

Figure 1:
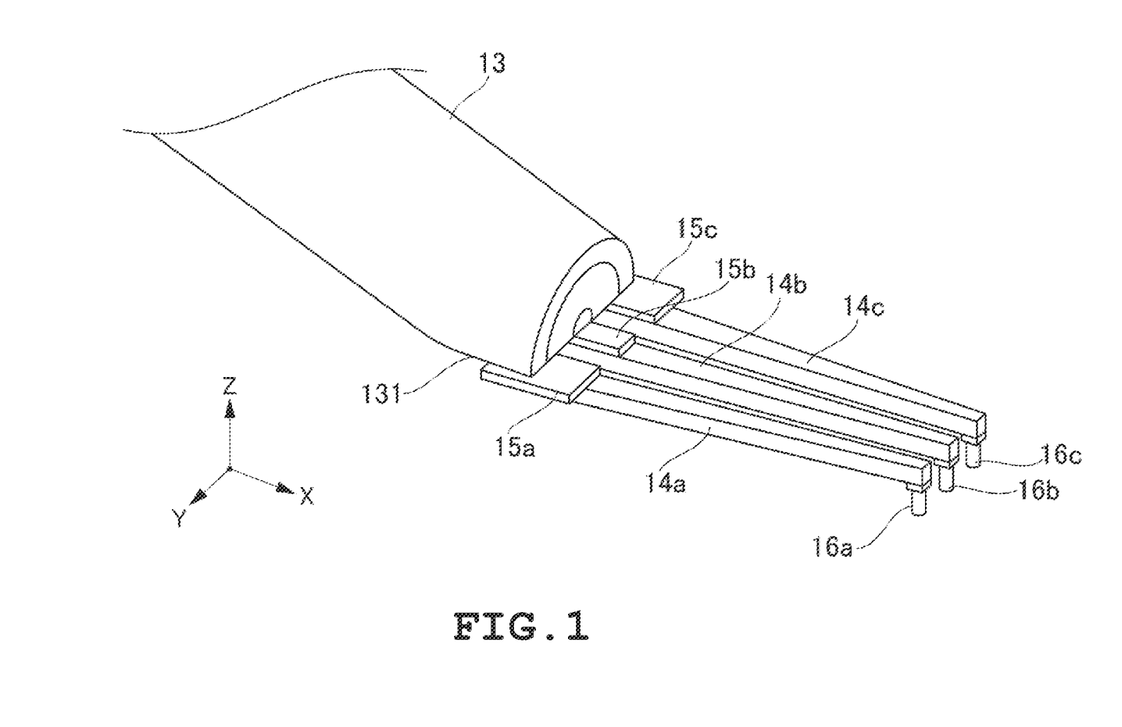
FIG. 1 is a partially enlarged view of a portion A in FIG. 2.

FIG. 1 is a partially enlarged view of a portion A in FIG. 2.

In FIG. 2, a probe unit 1 according to the first embodiment includes a main body 11, a coaxial connector 12, a high-frequency conducting path 13, a plurality of contactors 14 (14a to 14c), and a plurality of pedestals 15.

When the configuration common to the contactors 14a to 14c, for example, is described, the contactors 14a to 14c are written and described as, for example, "the contactors 14"; when the individual configurations of the contactors 14a to 14c, for example, are described, the contactors 14a to 14c are written and described as, for example, "the contactor 14a", "the contactor 14b", and "the contactor 14c". The same applies to the other constituent elements.

The probe unit 1 is, for example, a high-frequency probe that is used when an inspection of the electrical characteristics of a high-frequency circuit as an object to be inspected is made. The probe unit 1 is also called a probe head.

A case where the probe unit 1 includes three contactors 14 and is a ground-signal-ground (GSG) type high-frequency probe is illustrated. The probe unit 1 is not limited thereto, however, and can also be applied to a high-frequency probe with a high-speed transmission line, such as a GS type high-frequency probe with two contactors 14 and a GSGS type or GSSG type high-frequency probe with four contactors 14.

The probe unit 1 is connected to a tester (not shown in FIG. 2) via a coaxial cable and can make electrical contact with an electrode terminal of the object to be inspected. For example, at the time of an inspection, in the probe unit 1, the coaxial connector 12 receives an input of an electrical signal from the tester, the high-frequency conducting path 13 relays the electrical signal to each contactor 14, and each contactor 14 supplies the electrical signal to the electrode terminal of the object to be inspected with which the contactor 14 is in electrical contact. Moreover, the probe unit 1 provides the tester with an electrical signal output from the object to be inspected supplied with the electrical signal. This allows the tester to make an inspection of the electrical characteristics of the object to be inspected.

The main body 11 includes a base portion 111 and a supporting portion 112. The supporting portion 112 of the main body 11 supports the coaxial connector 12 and the high-frequency conducting path 13 in such a way that they are inclined in order to allow the tip of each contactor 14 joined to the high-frequency conducting path 13 to reliably make electrical contact with the electrode terminal of the object to be inspected.

The coaxial connector 12 is connected to the coaxial cable connected to the tester. For example, as illustrated in FIG. 2, the coaxial connector 12 is fixed to a fixture with the position of the coaxial connector 12 being inclined and is attached to the supporting portion 112 of the main body 11.

The high-frequency conducting path 13 is an electric circuit that relays an electrical signal to the coaxial connector 12 and each contactor 14, and a coaxial semirigid cable, for example, can be applied to the high-frequency conducting path 13. One end of the high-frequency conducting path 13 is connected to the coaxial connector 12 and the other end is joined to the plurality of contactors 14.

A part of the other end of the high-frequency conducting path 13 is cut to form a level end face (also referred to as a "joint surface") 131 in order to make the contactors 14 level. The plurality of contactors 14 are joined to the end face 131 of the high-frequency conducting path 13.

The contactor 14 makes electrical contact with the electrode terminal of the object to be inspected and is a ground line or a signal line of the high-frequency probe.

The contactor 14 is formed of a conductive material. One end of the contactor 14 is joined to the pedestal 15 and joined to the end face 131 of the high-frequency conducting path 13 with the pedestal 15 being placed therebetween, and the other end has, on the underside thereof, a contact portion 16 that makes electrical contact with the electrode terminal of the object to be inspected. As described above, the contactor 14 is a cantilever type probe (contactor) that is supported on the end face 131 of the high-frequency conducting path 13 with the pedestal 15 being placed therebetween and has a uniform thickness. Moreover, the contactor 14 has a uniform board thickness and has an approximately triangular shape in a plan view, with the width thereof decreasing in the longitudinal direction toward the side where the object to be inspected is located. It is to be noted that the shape of the contactor 14 is not limited to this shape.

The contact portion 16 is a portion that makes electrical contact with the electrode terminal of the object to be inspected and is formed of a conductive material. In this embodiment, a case where the contact portion 16 is a circular cylinder is illustrated; the shape of the contact portion 16 is not limited thereto and may be a triangular pyramid, a pyramid or the like.

The pedestal 15 is a component that is interposed between the contactor 14 and the end face 131 of the high-frequency conducting path 13 and is formed of a conductive component such as a nickel alloy. The pedestal 15 maintains the free length of the contactor 14, which is a cantilever, when the contactor 14 is joined to the high-frequency conducting path 13. It can be said that the pedestal 15 is a free length adjusting component that adjusts the free length of the contactor 14.

Moreover, the pedestal 15 can make dynamic physical quantities (for example, pressure, stress, shearing force, and moment of force) that develop in the plurality of contactors 14 nearly equal when the contactors 14 make contact with the electrode terminals of the object to be inspected, which allows stable contact to be made and improves measurement quality.

The pedestal 15 is provided for each contactor 14. The pedestal 15 is a component having a uniform thickness and, though not limited to a particular shape, the planar shape of the pedestal 15 may be a rectangle, a square or the like.

Next, a joint structure of the contactor 14 that is joined to the end face 131 of the high-frequency conducting path 13 will be described using the drawings.

Figure 3A:
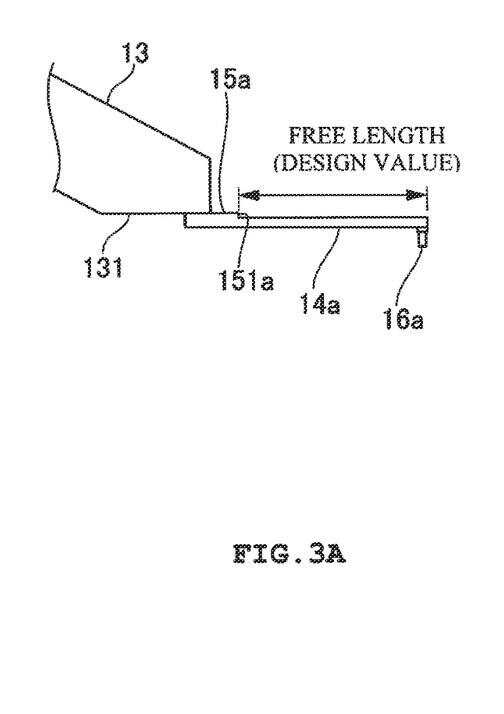
FIGS. 3A and 3B are a side view and a bottom view, respectively, of a joint structure of a contactor according to the first embodiment.
Figure 3B:
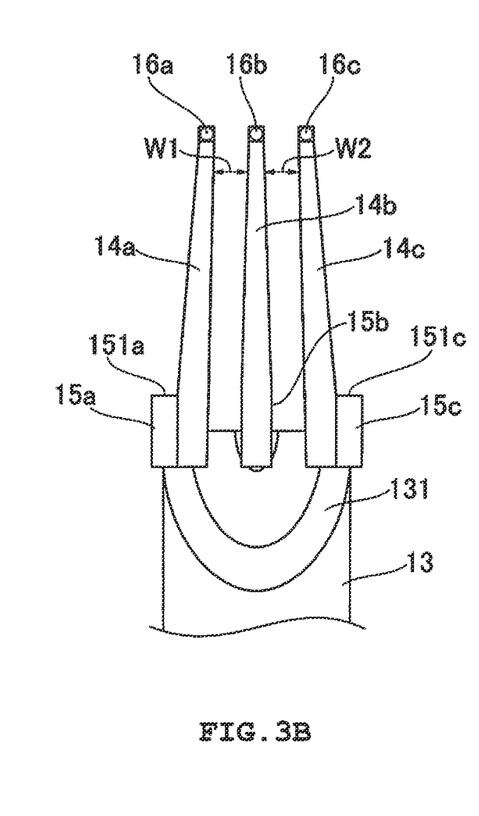
Figure 4A:
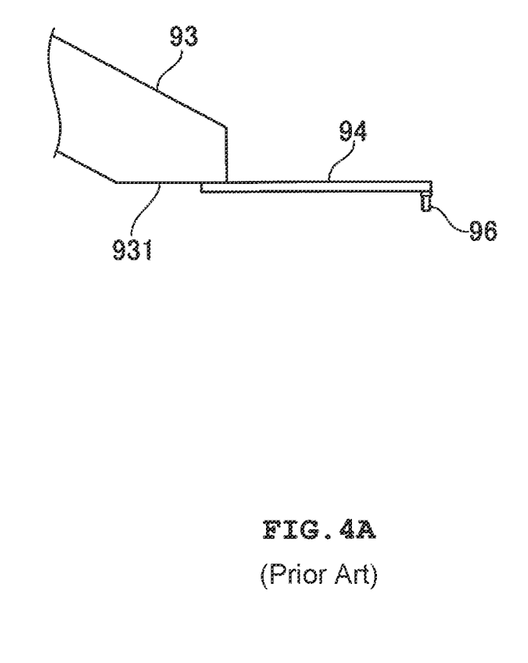
FIGS. 4A and 4B are a side view and a bottom view, respectively, of a joint structure of a conventional contactor.

FIG. 3A is a side view of the joint structure of the contactor 14 according to the first embodiment and FIG. 3B is a bottom view thereof. FIG. 4A is a side view showing a joint structure of a conventional contactor 94 and FIG. 4B is a bottom view thereof.

Figure 5A:
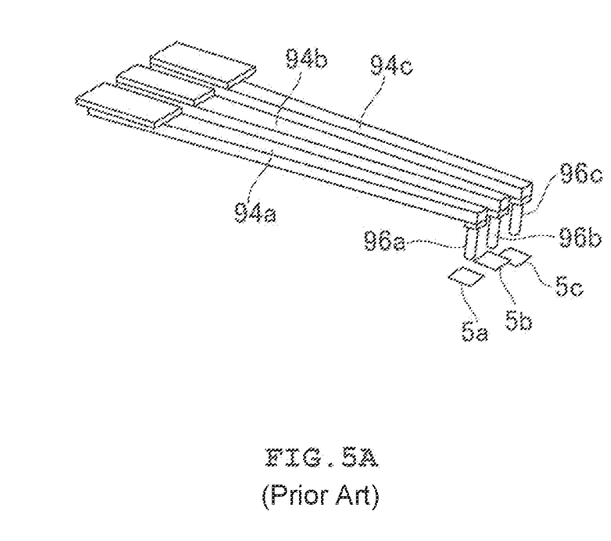
FIGS. 5A and 5B are explanatory diagrams explaining the manner in which the conventional contactor makes contact with an electrode terminal of an object to be inspected in the first embodiment.
Figure 5B:
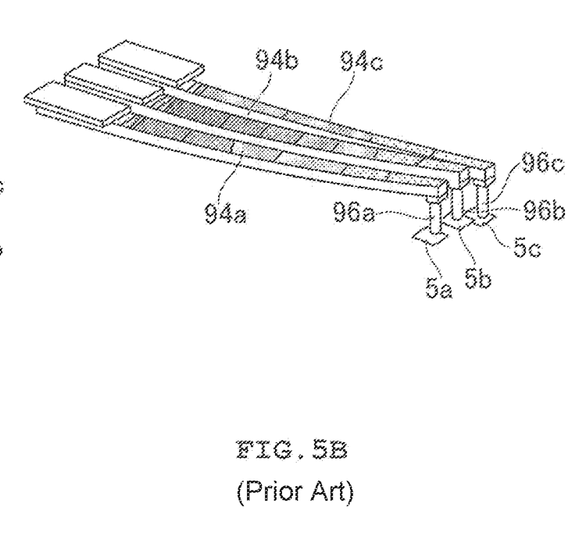

FIGS. 5A and 5B are explanatory diagrams explaining the manner in which contactors 94a to 94c make contact with electrode terminals 5a to 5c of an object to be inspected. In FIGS. 5A and 5B, a joint surface of a high-frequency conducting path 93 to which the contactors 94a to 94c are joined is illustrated in an abstract manner.

Figure 4B:
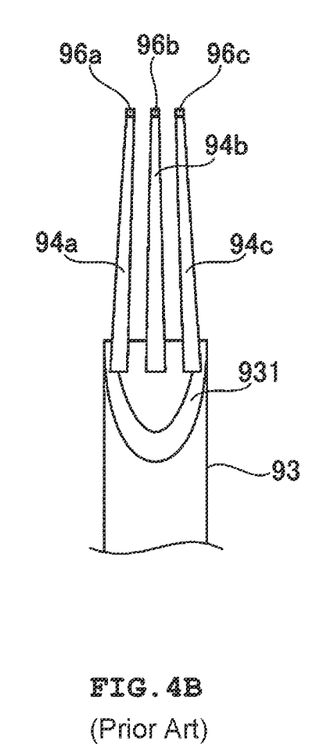

As illustrated in FIGS. 4A and 4B, conventionally, an end face 931 of the high-frequency conducting path 93 and the contactor 94 have been directly joined together by a technique such as brazing, ultrasonic bonding, resistance welding, or laser welding.

The contactor 94 is a cantilever type probe that is supported on the end face 931 of the high-frequency conducting path 93. Therefore, for example, as illustrated in FIG. 5A, even when the electrode terminals 5 of the object to be inspected vary in height, the contactors 94 are elastically deformed and can make contact with the electrode terminals 5 with stability (see FIG. 5B).

For example, as shown in FIG. 5B, when the electrode terminal 5b is higher than the other electrode terminals 5a and 5c, greater pressure develops in the contactor 94b when the contactor 94b is brought into contact with the electrode terminal 5b than in the other contactors 94a and 94c, and the contactor 94b is elastically deformed more greatly than the other contactors 94a and 94c.

The contactor 94 is a microscopic structure fabricated by micro electromechanical systems (MEMS) or the like; therefore, when the contactor 94 is joined to the high-frequency conducting path 93, the contactor 94 is sometimes joined to a position that deviates from the designed joint position.

When the contactor 94 is joined to a position that deviates from a joint position in the high-frequency conducting path 93, the free length of the contactor 94 changes, which affects the amount of pressure that develops in the contactor 94 at the time of contact. This makes it impossible to make stable contact with the electrode terminal of the object to be inspected and can affect measurement quality.

For this reason, in the first embodiment, the pedestal 15 is provided such that the free length of the contactor 14 is equal to the design value even when the contactor 14 is joined to a position that deviates from the design value of a joint position in the high-frequency conducting path 13.

As shown in FIG. 3A, the pedestal 15 is interposed between the high-frequency conducting path 13 and the contactor 14. When the free length of the contactor 14 is designed and the contactor 14 and the pedestal 15 are joined together, the contactor 14 and the pedestal 15 are joined together such that the length from the position of an end face 151 of the pedestal 15 to the position of the contact portion 16 is equal to the designed free length in the longitudinal direction of the contactor 14.

That is, the contactor 14 and the pedestal 15 are joined together such that the length from the position of the end face 151 of the pedestal 15 to the position of the contact portion 16 is equal to the design value. Then, the contactor 14 is joined to the high-frequency conducting path 13 by joining together the pedestal 15 provided in the contactor 14 and the end face 131 of the high-frequency conducting path 13.

By joining the contactor 14 to the high-frequency conducting path 13 with the pedestal 15 interposed therebetween as described above, the free length of the contactor 14 can maintain the design value, which makes it possible to keep the pressure of the contactor 14 at a value that approximates the design value, make stable contact with the electrode terminal, and improve measurement quality.

Figure 6A:
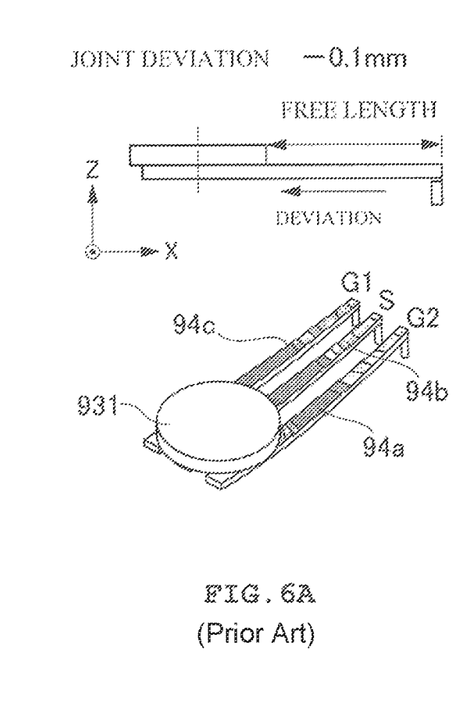
FIGS. 6A to 6C show models in which the conventional contactor is joined to a position that deviates from a joint position and stress analysis diagrams at the time of overdrive.
Figure 6B:
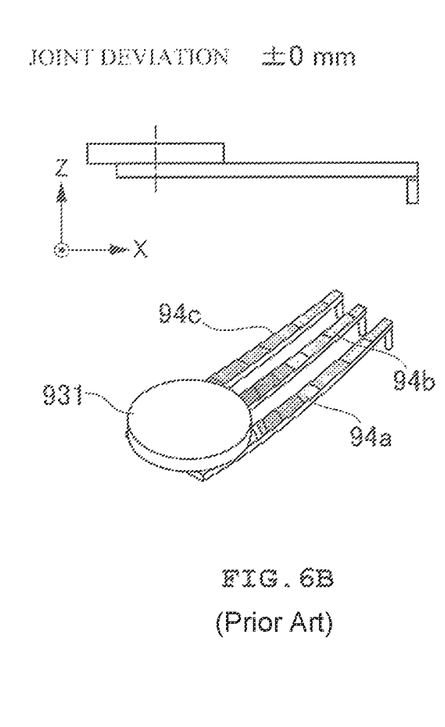
Figure 6C:
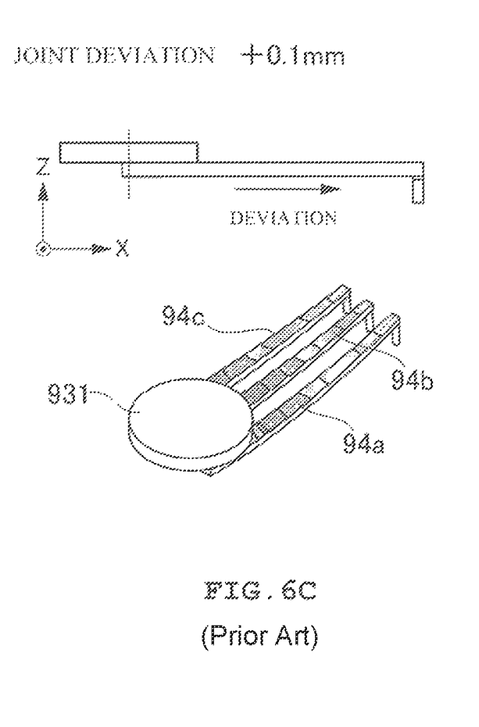
Figure 7:
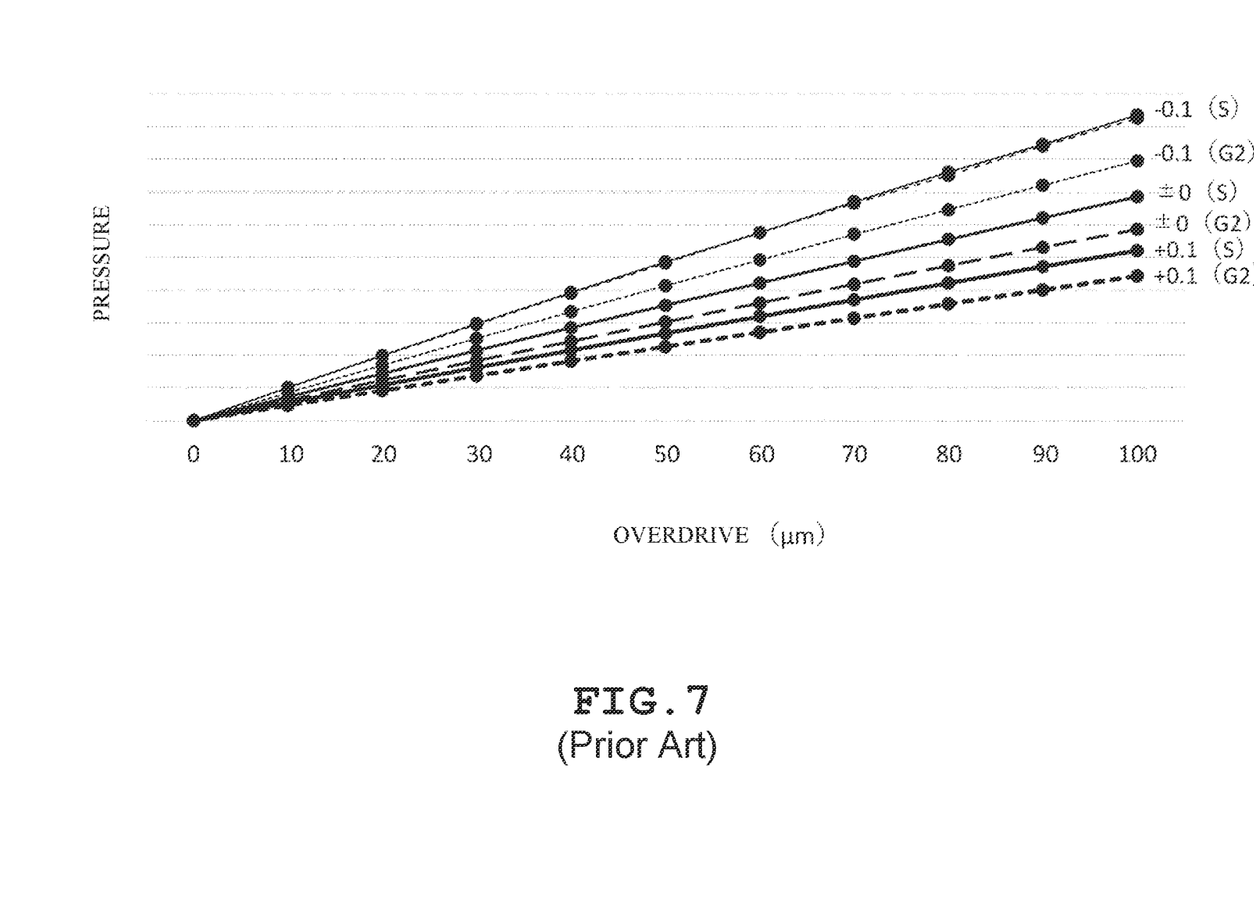
FIG. 7 is a diagram showing the relationship between the pressure that developed in the conventional contactor and overdrive.

FIGS. 6A to 6C show models in which the contactor 94 is joined to a position that deviates from a joint position in the high-frequency conducting path 93 and stress analysis diagrams at the time of overdrive. The joint surface of the high-frequency conducting path 93 to which the contactor 94 is joined is illustrated in an abstract manner also in the stress analysis diagrams of FIGS. 6A to 6C.

As shown in FIG. 6B, when the contactor 94 is joined to a position that does not deviate from the design value (for example, the value of joint deviation=±0 mm), the stress analysis diagram of the contactors 94 at the time of overdrive reveals that nearly equal pressure develops in the three contactors 94. Moreover, the amount of the pressure of each contactor 94 is also a value close to the design value (the designed pressure value).

FIG. 6A shows a stress analysis diagram observed when the contactor 94 was joined to a position that deviates from the design value in a −X direction (for example, the value of joint deviation=−0.1 mm). In this case, since the free length of the contactor 94 is shorter than the design value, the amount of the pressure of each contactor 94 at the time of overdrive is greater than the amount (the designed pressure value) of the pressure of each contactor 94 of FIG. 6B.

FIG. 6C shows a stress analysis diagram observed when the contactor 94 was joined to a position that deviates from the design value in a +X direction (for example, the value of joint deviation=+0.1 mm). In this case, a comparison with the amount of the pressure of each contactor 94 of FIG. 6B reveals that the amount of the pressure of each contactor 94 of FIG. 6C is smaller than the amount (the designed pressure value) of the pressure of each contactor 94 of FIG. 6B.

As shown in FIGS. 6A to 6C and FIG. 7, joining the contactor 94 at a position deviated from the design value causes a change in the free length of the contactor 94, which affects the amount of the pressure of the contactor 94.

Figure 8A:
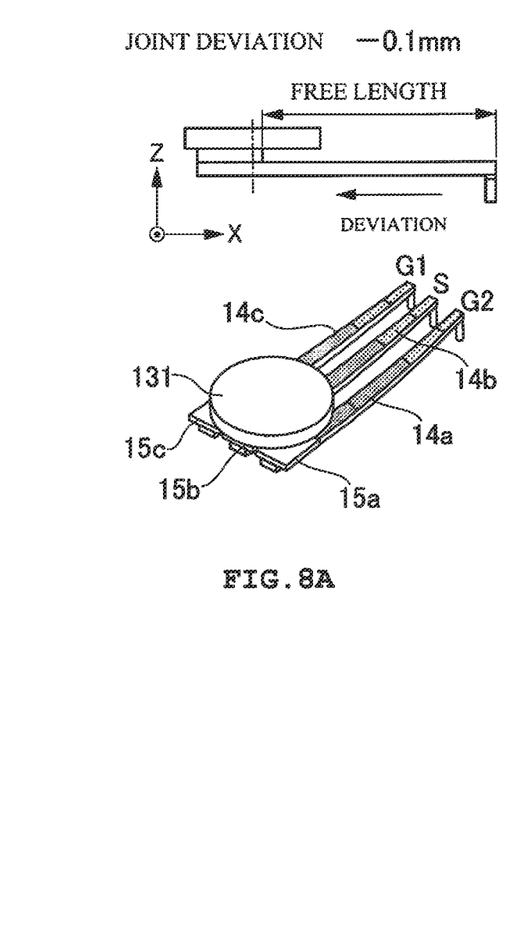
FIGS. 8A to 8C show models in which the contactor of the first embodiment is joined to a position that deviates from a joint position and stress analysis diagrams at the time of overdrive.
Figure 8B:
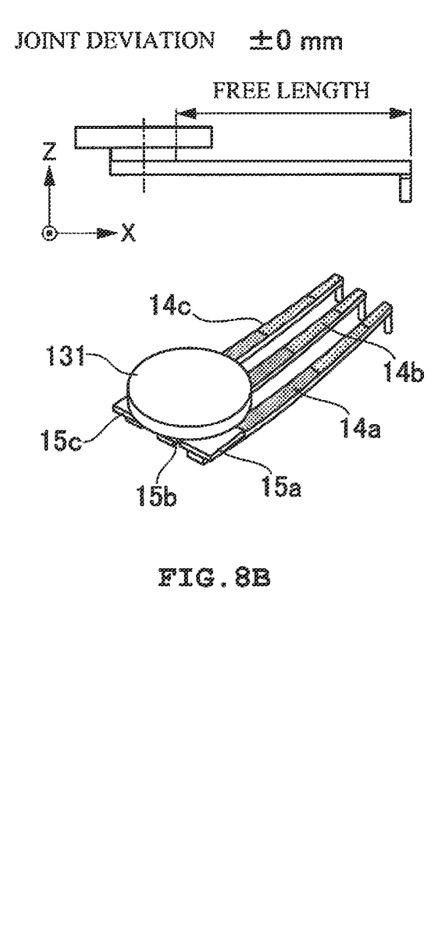
Figure 8C:
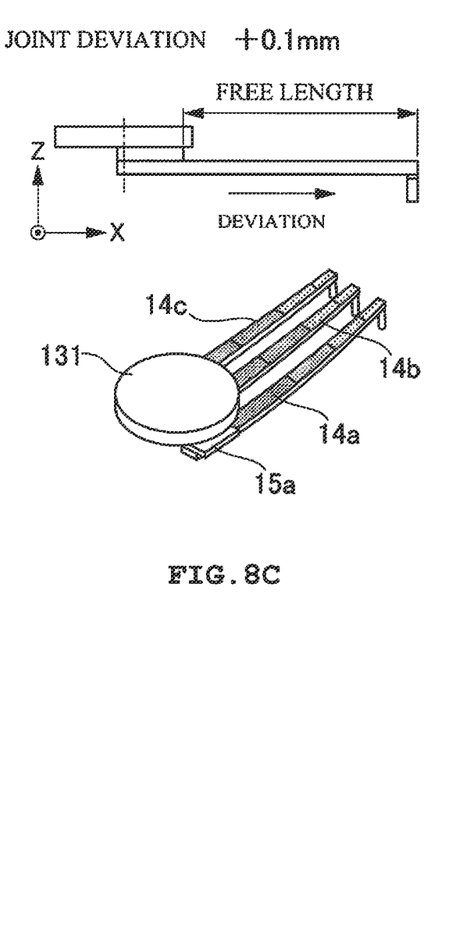

FIGS. 8A to 8C show joint models in which the pedestal 15 provided in the contactor 14 is joined to the high-frequency conducting path 13 and stress analysis diagrams at the time of overdrive in the first embodiment.

In FIG. 8B, when the contactor 14 provided with the pedestal 15 is joined to the high-frequency conducting path 13, the contactor 14 is joined to a position that does not deviate from the design value (for example, the value of joint deviation=±0 mm). In this case, since the free length of the contactor 14 is equal to the design value, the amount of pressure that develops in each contactor 14 at the time of overdrive is a value close to the design value.

Moreover, even when the contactor 14 is joined to a position that deviates from the design value in the −X direction (for example, the value of joint deviation=−0.1 mm) as in FIG. 8A and even when the contactor 14 is joined to a position that deviates from the design value in the +X direction (for example, the value of joint deviation=+0.1 mm) as in FIG. 8C, the free length of the contactor 14 does not change and can maintain the design value.

Figure 9:
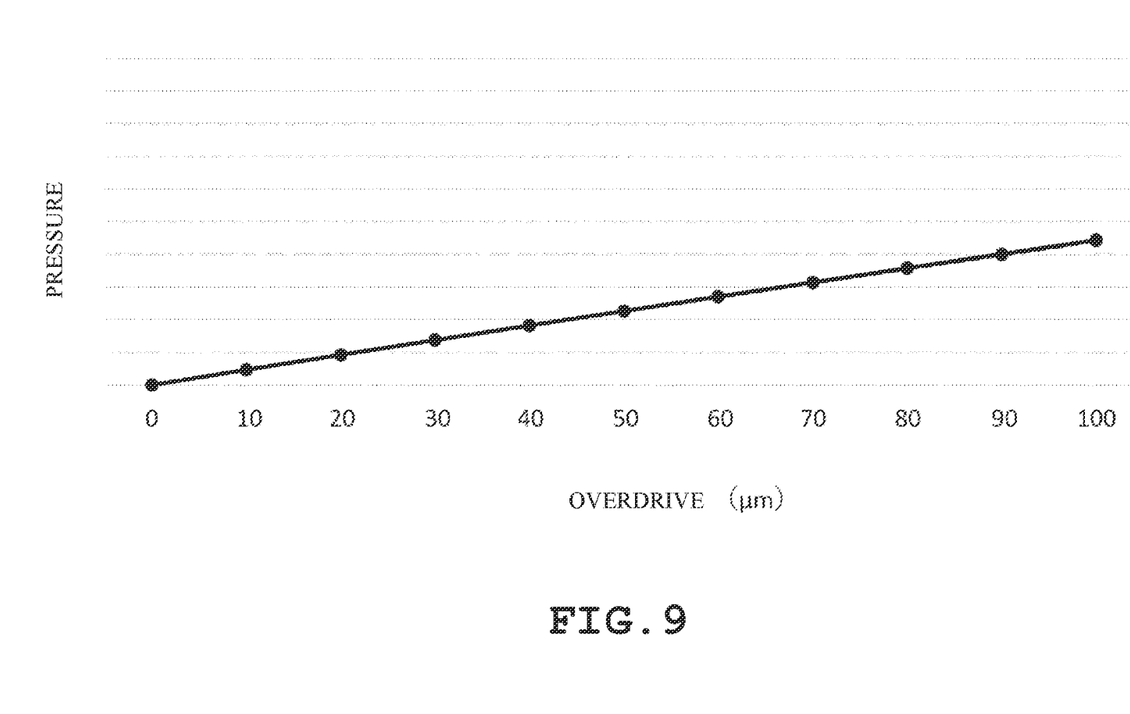
FIG. 9 is a diagram showing the relationship between the pressure that developed in the contactor of the first embodiment and overdrive.

Thus, as shown in FIG. 9, since it is possible to maintain the free length of each contactor 14 as specified in the design irrespective of a joint position, the amount of pressure that develops in each contactor 14 at the time of overdrive is a value close to the design value. This makes it possible to make reliable and stable contact with the electrode terminal and also improves measurement quality.

As described earlier, by interposing the pedestal 15 between the contactor 14 and the high-frequency conducting path 13 when joining the contactor 14 to the high-frequency conducting path 13, it is possible to maintain the free length of the contactor 14 as specified in the design.

The contactor 14 and the pedestal 15 can be joined together and the pedestal 15 and the high-frequency conducting path 13 can be joined together using a technique such as brazing, ultrasonic bonding, resistance welding, or laser welding.

Moreover, when each of the plurality of contactors 14 is joined to the end face 131 of the high-frequency conducting path 13, the impedance (output impedance) on the side where the high-frequency conducting path 13 is located and the impedance (input impedance) on the side where the plurality of contactors 14 are located are designed to be equal to each other.

For example, in order to prevent a standing wave, which interferes with transmission of a high-frequency signal, from being generated by reflection, impedance matching is performed such that the input and output impedance has an impedance value of 50Ω, for example. The characteristic impedance $Z_0$ in a high-frequency probe that transmits a high-frequency signal has characteristics expressed by formula (1).

$$Z_0 = \sqrt{L/C} \quad (1)$$

In formula (1), C represents capacitance and L represents inductance. The capacitance C is proportional to permittivity εy and a line width and is inversely proportional to a space.

For characteristic impedance matching, the contactors 14 are made to have a uniform thickness and a uniform "line width". Furthermore, to make a "space" uniform, the contactor 14a and the contactor 14b are joined such that the gap between the contactor 14a and the contactor 14b has the designed gap length value w1. Likewise, the contactor 14b and the contactor 14c are joined such that the gap between the contactor 14b and the contactor 14c has the designed gap length value w2.

Moreover, in FIG. 3B, the width (the length in a Y direction) of the pedestal 15a and the pedestal 15c corresponding to the contactor 14a and the contactor 14c, which are ground lines, is designed to be larger than the width of the contactor 14a and the contactor 14c. Furthermore, the width of the pedestal 15b corresponding to the contactor 14b, which is a signal line, is designed to be nearly equal to the width of the contactor 14b.

(A-2) Effects of First Embodiment

As described above, according to the first embodiment, by providing the pedestal in the contactor such that the length from the position of the pedestal end face to the position of the contact portion is equal to the designed free length in the longitudinal direction of the contactor, it is possible to join the contactor to the high-frequency conducting path without a change in the free length of the contactor, which makes it possible to make stable contact and also improves measurement quality.

(B) Second Embodiment

Next, a second embodiment of the probe unit according to the present disclosure will be described in detail with reference to the drawings.

(B-1) Configuration of Second Embodiment

A probe unit according to the second embodiment is written as a probe unit 1A and a contactor according to the second embodiment is written as a contactor 24 or the like.

The basic configuration of the probe unit 1A of the second embodiment is the same as the configuration of the probe unit 1 of FIG. 2 of the first embodiment. Therefore, a description is given using FIG. 2 of the first embodiment also in the second embodiment.

Figure 10A:
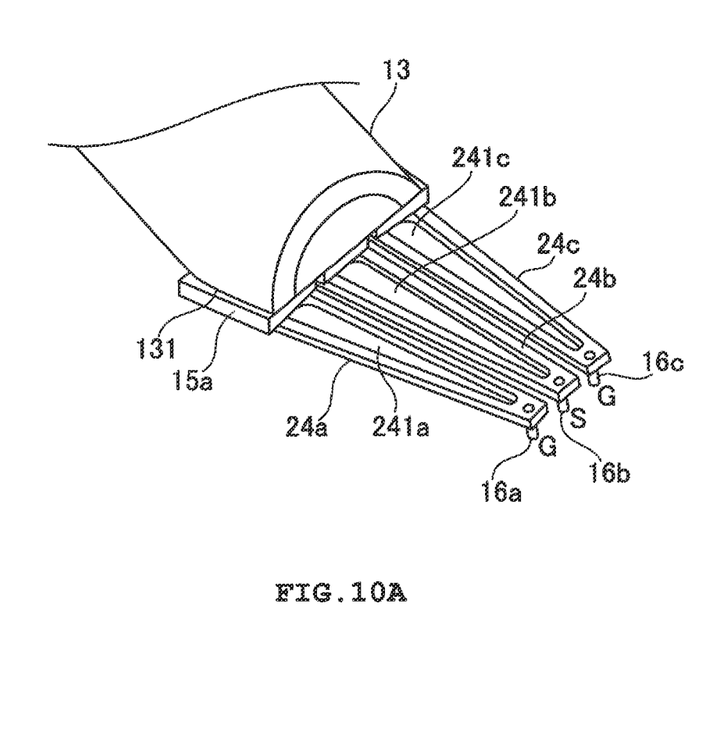
FIGS. 10A and 10B are a partially enlarged view and a bottom view, respectively, of a contactor of a probe unit of a second embodiment.
Figure 10B:
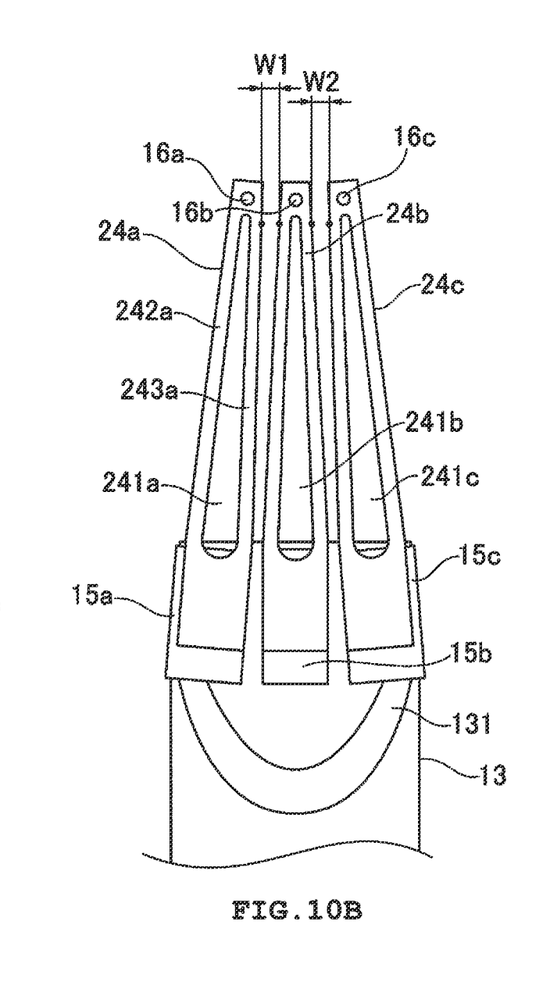

FIG. 10A is a partially enlarged view of a portion A of the probe unit 1A of the second embodiment in FIG. 2 and FIG. 10B is a bottom view of the portion A.

In the probe unit 1A of the second embodiment, the structure of the contactor 24 is different from that of the contactor 14 of the first embodiment. Thus, in the second embodiment, the structure of the contactor 24 will be the focus of what is described in detail.

As in the case of the first embodiment, in the probe unit 1A of the second embodiment, a pedestal 15 is provided for each contactor 24, and a high-frequency conducting path 13 and the contactor 24 are joined together with the pedestal 15 being interposed therebetween.

As shown in FIG. 10A, as in the case of the first embodiment, the contactor 24 (24a, 24b, 24c) is a ground line or a signal line of a high-frequency probe. Moreover, the contactor 24 is formed of a conductive material and formed so as to have a uniform thickness. Furthermore, the contactor 24 is supported on an end face 131 of the high-frequency conducting path 13 with the pedestal 15 being placed therebetween.

The contactor 24 has a hole formed in a central area thereof so as to pass therethrough in a thickness direction (a direction orthogonal to an arrangement direction of each contactor 24), and this hole is also referred to as a space area 241.

The reason why the space area 241 is formed in the contactor 24 will be given below. It is necessary to match the impedance of the probe unit 1A to that of the high-frequency conducting path 13. For example, in the first embodiment, impedance matching is achieved by making the contactors 14 have a uniform thickness and making uniform the air gap between the contactor 14a (or the contactor 14c) which is a ground line and the contactor 14b which is a signal line.

However, when a probe is designed with priority given to impedance matching, problems might arise such as too high or too low pressure (for example, stress, shearing force, moment of force or the like) that develops in the contactor.

For this reason, in the second embodiment, by forming the space area passing through the contactor 24 in a direction in which the contactor 24 is deformed, the amount of pressure that develops in the contactor 24 is adjusted without a change in the thickness of the signal line and the ground line (the thickness of the contactor 24) and the air gap length between the signal line and the ground line (between the contactors 24).

The characteristic impedance $Z_0$ has characteristics expressed by formula (1) described earlier.

As described earlier, in formula (1), the capacitance C is proportional to permittivity εy and a line width and is inversely proportional to a space. Consequently, the characteristic impedance $Z_0$ converges to the capacitance C and the inductance L and is influenced by the electrical characteristics of a component material, the width of the contactor 24, the thickness of the contactor 24, and the degree of proximity of the signal line and the ground line (the air gap length between them).

In the second embodiment, the contactors 24 have a uniform thickness and the air gap length between the signal line and the ground line is also uniform. Thus, the space area 241 is provided so as to make uniform the width of an edge portion 242 and an edge portion 243, each being a part of the contactor 24 surrounding the space area 241.

A description is given by taking the structure of the contactor 24a of FIG. 10B as an example. The contactor 24b which is the signal line and the contactor 24c which is the ground line also have the same structure.

In the example of FIG. 10B, the edge portion 242a and the edge portion 243a are end portions of the contactor 24a, which is nearly triangular in a plan view in a width direction (the Y direction). In other words, the edge portion 242a and the edge portion 243a are located at both ends of the space area 241a in a horizontal direction (the Y direction). Moreover, the width of the edge portion 242a and the edge portion 243a in the width direction is uniform in free length.

As described above, by providing the space area 241 in each contactor 24, it is possible to achieve impedance matching while adjusting the pressure of each contactor 24 without changing the thickness of each contactor 24 and the air gap between the signal line and the ground line.

(B-2) Effects of Second Embodiment

As described above, according to the second embodiment, in addition to the effects described in the first embodiment, the following effects can be obtained.

According to the second embodiment, by forming the space area in the signal line and the ground line while maintaining the uniform thickness of the signal line and the ground line and the uniform length of an air gap between the signal line and the ground line, it is possible to adjust impedance while adjusting the pressure that develops in the contactor at the time of contact.

(C) Other Embodiments

While various modifications have been mentioned in the above-described first and second embodiments, the present disclosure can also be applied to the following modifications.

(C-1) In the second embodiment, a case where the space area 241 is a nearly triangular elongated hole in accordance with the shape of the contactor 24 has been illustrated; the shape of the space area 241 is not limited thereto.

Moreover, two lines of space areas may be placed in the longitudinal direction of the contactor 24; in that case as well, the width of an edge portion which is present between the two lines of space areas of the contactor is uniform.

(C-2) In the embodiments described above, a case where the contactor has a nearly triangular shape in a plan view has been illustrated; the shape of the contactor is not limited to a particular shape.

(C-3) In the embodiments described above, an example in which the pedestal is joined to the contactor has been described; the contactor may be integrally formed with the pedestal by MEMS or the like.

REFERENCE SIGNS LIST 1 and 1A probe unit
5 (5a to 5c) electrode terminal
11 main body
111 base portion
112 supporting portion
12 coaxial connector
13 high-frequency conducting path
131 end face
14 (14a to 14c) and 24 (24a to 24c) contactor
15 (15a to 15c) pedestal
151 end face
16 contact portion
241 space area
242a edge portion
243a edge portion

The invention claimed is:

1. A probe unit comprising:
a coaxial connector that is attached to a main body and gives and receives an electrical signal to and from a tester via a coaxial cable;
a high-frequency conducting path that is connected to the coaxial connector and transmits an electrical signal;
a plurality of contactors, each having a tip portion at a distal end that makes electrical contact with an electrode of an object to be inspected to transmit an electrical signal to the electrode from the high-frequency conducting path and from the electrode to the high-frequency conductive path; and
pedestals interposed between said contactors and the high-frequency conducting path,
wherein the pedestals are each joined to the high-frequency conductive path and fixed to a respective one of said contactors,
wherein a free length of each of the contactors extends from the distal end of the respective contactor to a position at which the respective contactor is fixed to one of the pedestals, and
wherein the free length of each of the contactors is a constant predetermined length to eliminate variations in pressure applied by the contactors to the electrodes of the object to be inspected.

2. The probe unit according to claim 1,
wherein each contactor is a cantilever type contactor.

3. The probe unit according to claim 2,
wherein each contactor has formed therein a space area which is a through hole, and includes a first edge portion and a second edge portion around the space area, and
wherein the space area is formed such that a width of the first edge portion and the second edge portion is a predetermined width.

4. The probe unit according to claim 3,
wherein the plurality of contactors include a contactor as a signal line and a contactor as a ground line.

5. The probe unit according to claim 2,
wherein the plurality of contactors include a contactor as a signal line and a contactor as a ground line.

6. The probe unit according to claim 1,
wherein each contactor is formed so as to be integral with the pedestal.

7. The probe unit according to claim 6,
wherein each contactor has formed therein a space area which is a through hole, and includes a first edge portion and a second edge portion around the space area, and
wherein the space area is formed such that a width of the first edge portion and the second edge portion is a predetermined width.

8. The probe unit according to claim 7,
wherein the plurality of contactors include a contactor as a signal line and a contactor as a ground line.

9. The probe unit according to claim 6,
wherein the plurality of contactors include a contactor as a signal line and a contactor as a ground line.

10. The probe unit according to claim 1,
wherein each contactor has formed therein a space area which is a through hole, and includes a first edge portion and a second edge portion around the space area, and
wherein the space area is formed such that a width of the first edge portion and the second edge portion is a predetermined width.

11. The probe unit according to claim 10,
wherein the plurality of contactors include a contactor as a signal line and a contactor as a ground line.

12. The probe unit according to claim 1,
wherein the plurality of contactors include a contactor as a signal line and a contactor as a ground line.

* * * * *